(12) United States Patent
Makinouchi et al.

(10) Patent No.: US 6,490,025 B1
(45) Date of Patent: *Dec. 3, 2002

(54) EXPOSURE APPARATUS

(75) Inventors: Susumu Makinouchi, Kanagawa (JP); Masato Takahashi, Kanagawa (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,562

(22) Filed: Mar. 16, 1998

(30) Foreign Application Priority Data

Mar. 17, 1997 (JP) .............................................. 9-083243
Mar. 31, 1997 (JP) .............................................. 9-096450

(51) Int. Cl.[7] .......................... G03B 27/42; H01L 21/30
(52) U.S. Cl. .......................... 355/53; 356/399; 248/638
(58) Field of Search .............................. 355/53, 72, 75; 248/638; 356/399, 400, 401

(56) References Cited

U.S. PATENT DOCUMENTS

| 5,172,160 A | 12/1992 | Van Eijk et al. | 355/53 |
| 5,187,519 A | * 2/1993 | Takabayashi et al. | 355/53 |
| 5,446,519 A | 8/1995 | Makinouchi | 355/53 |
| 5,477,304 A | 12/1995 | Nishi | 355/53 |
| 5,539,497 A | * 7/1996 | Nishi | 355/53 |
| 5,610,686 A | 3/1997 | Osanai | 355/72 |
| 5,663,783 A | * 9/1997 | Ueda | 355/53 |
| 5,686,991 A | * 11/1997 | Yamazaki | 356/399 |
| 5,699,145 A | 12/1997 | Makinouchi et al. | 355/53 |
| 5,812,420 A | * 9/1998 | Takahashi | 355/53 |
| 5,900,707 A | 5/1999 | Wakui | 318/625 |

FOREIGN PATENT DOCUMENTS

| GB | 2299867 A | * 10/1996 |
| JP | 7-29801 | 1/1995 |
| JP | 08-292814 | 11/1996 |
| JP | 10-12513 | 1/1998 |

* cited by examiner

*Primary Examiner*—Alan A. Mathews

(57) ABSTRACT

An exposure apparatus for projecting an image pattern on a mask onto a photosensitive substrate, including: a body including a projecting optical system through which the image pattern is projected from the mask to the photosensitive substrate; a first stage movable to the body and adapted to mount the mask; a second stage movable to the body and adapted to mount the photosensitive substrate; a measuring device for measuring the position of either one of the mask mounted on the first stage and the photosensitive substrate mounted on the second stage; a vibration sensor for measuring vibration of the body; and a position controller for controlling the position of either one of the mask mounted on the first stage and the photosensitive substrate mounted on the second stage based on a measurement value of the vibration sensor and a measurement value of the measuring device.

30 Claims, 5 Drawing Sheets

EXPOSURE APPARATUS

BACKGROUND OF THE INVENTION

1. Field of the Invention

The present invention relates to an exposure apparatus, more particularly to an exposure apparatus which is used during manufacturing semiconductor devices, liquid crystal display devices and the like in a lithography step and to an exposing method.

2. Related Background Art

A projection exposure apparatus has been used, which projects patterns of a photomask and a reticle (hereinafter referred to as a reticle) under exposure light onto a photosensitive substrate via a projection optical system during manufacturing semiconductor devices, liquid crystal display devices. U.S. Pat. No. 5,477,304 disclosed an exposure apparatus capable of performing an accurate exposure with the combination of a coarse motion stage and a fine motion stage for a reticle. Further, U.S. Pat. No. 5,172,160 discloses an exposure apparatus having a device capable of suppressing a vibration of the apparatus.

SUMMARY OF THE INVENTION

However, in the foregoing conventional exposure apparatuses, it is difficult to sufficiently suppress a faulty exposure due to vibrations of the exposure apparatus boy.

From the view point of the above described circumferences, the object of the present invention is to provide an exposure apparatus which is capable of suppressing an occurrence of a faulty exposure due to vibrations of the exposure apparatus body and performing a high accuracy exposure.

It is an object of the present invention to provide an exposure apparatus for projecting an image pattern on a mask onto a photosensitive substrate, the apparatus comprising: a body; a first stage movable to the body and adapted to mount the mask; a second stage movable to the body and adapted to mount the photosensitive substrate; a measuring device for measuring the position of either of the mask mounted on the first stage or the photosensitive substrate mounted on the second stage; a vibration sensor for measuring vibration of the body; and a position controller for controlling the position of either the mask mounted on the first stage or the photosensitive substrate mounted on the second stage based on a measurement value of the vibration sensor and a measurement value of the measuring device.

According to the exposure apparatus of the present invention, the position of either the mask or the photosensitive substrate is directly measured by the measuring means, and the vibrations of the portion in the exposure apparatus body as well as the portion other than that of either the mask or the photosensitive substrate is measured by the vibration sensor. Then, the position control system controls the position of either the mask or the photosensitive substrate based on the measurement values of the vibration sensor and the measuring means.

According to the present invention, when the vibrations are caused in the exposure apparatus body, the vibrations are measured by the vibration sensor, and the errors caused in the measurement values of the measuring means are corrected by the position control system using the measurement results, whereby the position deviation between the mask and the photosensitive substrate due to the vibrations is prevented, resulting in the suppression of the occurrence of the faulty exposure.

Moreover, various kinds of the vibration sensors that can be used in the invention are taken into consideration. It is sufficient that the foregoing vibration sensor may be an acceleration meter. Since the vibrations can be directly measured by the acceleration meter, the vibrations can be measured more precisely. As another vibration sensor, if the vibration sensor is placed at a position where it is not influenced by the vibrations of the apparatus body, the vibration sensor may be constituted by combining it with a displacement sensor such as a laser interference meter and a circuit to differentiate the measurement values of the displacement sensor twice. It is another object of the present invention to provide a method of projecting a pattern image on a mask on to a photosensitive substrate, using an exposure apparatus comprising a a body with projection optical system for projecting the pattern on the photosensitive substrate; a first stage movable to the body and adapted to mount the mask; and a second stage movable to the body and adapted to mount the photosensitive substrate, the method comprising the steps of: mounting the mask on the first stage; mounting the photosensitive substrate on the second stage; directly measuring the position of either one of the mask and the photosensitive substrate to provide a first data; measuring vibrations of the body, using a vibrator attached to the body, to a second data; and controlling either one of the mask and the photosensitive substrate based on the first data and the second data to prerform the projective exposure.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

For a more complete understanding of the present invention and the advantages thereof, reference is now made to the following description taken in conjunction with the accompanying drawings.

DESCRIPTION OF THE PREFERRED EMBODIMENTS

The first embodiment of the present invention will be described with reference to FIGS. 1 and 2 below.

Figure 1:
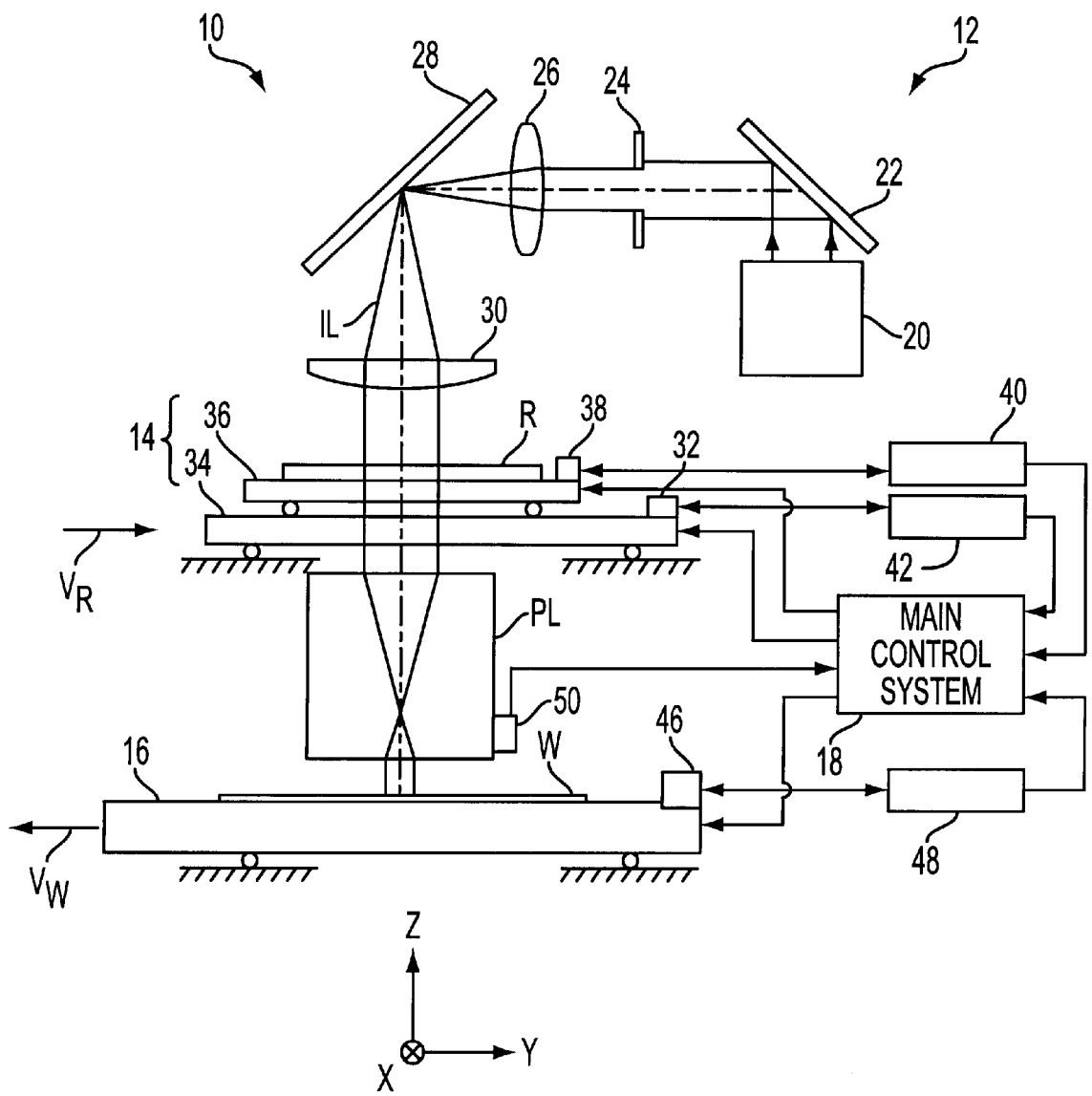
FIG. 1 is a schematic view showing a construction of a scan type exposure apparatus according to an embodiment of the present invention.

In FIG. 1, a schematic constitution of a scan type exposure apparatus 10 serving as an exposure apparatus according to an embodiment is shown. The scan exposure apparatus 10 shown in FIG. 1 comprises an illumination system 12 for illuminating a reticle R as a mask using an exposure light IL; a reticle stage 14 as a mask stage for scanning the reticle R in Y-axis direction (in the horizontal direction in FIG. 1) and for performing a fine motion on an X and Y-plane; a projection optical system disposed under the reticle stage 14; a wafer stage 16, disposed under the projection optical system PL, for moving a wafer W as a photosensitive substrate on the X and Y-plane two-dimensionally; and a main control system 18 composed of a microcomputer (or a minicomputer) to control the whole of the apparatus as a whole.

A reticle stage 14, a wafer stage 16 and a projection optical system PL are held by a body which is mounted on pads.

The illumination system 12 is composed of a light source portion 20; a mirror 22; a reticle blind 24; a relay lens 26; a mirror 28; and a condenser lens 30. Among these components, the light source portion 20 consists of a light source such as a ultrahigh pressure mercury lamp or laser light source, and an optical integrator. The reticle blind 24 is disposed at a position conjugated with a pattern formation plane that is a under surface of the reticle R.

The exposure light IL emitted from the light source portion 20 passes through the mirror 22, the reticle blind 24, the relay lens 26, the mirror 28 and the condenser lens 30 in this order and illuminates slit-shaped illuminated regions formed by the reticle blind 24 on the reticle R with an even illuminance. In this case, the longitudinal direction of the slit-shaped illuminated regions is set to the X-direction that is perpendicular to the paper plane in FIG. 1 and the direction of the relative scan of the reticle R and the slit-shaped illuminated regions are set to the Y-direction.

The reticle stage 14 comprises a reticle coarse motion stage 34 which moves along the scan direction (the Y-direction) on a reticle base (not shown) and a reticle fine motion stage 36 mounted on the reticle coarse motion stage 34, which finely moves on the X and Y-plane while holding the reticle R, the reticle fine motion stage 36 performing also rotational movement.

A movement mirror 32 is provided on the reticle coarse motion stage 34. A reticle coarse motion laser interference meter 42 is disposed so as to face the movement mirror 32, which projects a laser beam onto the movement mirror 32 to detect the position of the reticle coarse motion stage 34 by receiving the reflection light. An output from the reticle coarse motion interference meter 42 is supplied to the main control system 18. The main control system 18 is designed such that it measures the position in the Y-direction of the reticle coarse motion stage 34 based on the output of the reticle coarse motion laser interference meter 42.

A movement mirror 38 is provided on the reticle fine motion stage 36. A reticle fine motion laser interference meter 40 is provided so as to face the movement mirror 38, which projects a laser beam onto the movement mirror 38 to detect, as a measuring means, the position of the reticle fine motion stage 36 by receiving the reflection light. Here, three movement mirrors in total are provided actually on the reticle fine motion stage 36, that is, an X-movement mirror having a reflection plane perpendicular to the X-axis direction, and two Y-movement mirrors having a reflection plane perpendicular to the Y-axis direction are provided thereon. Accordingly, three reticle fine motion laser interference meters are provided in total, that is, an X-axis direction position measuring interference meter and two Y-axis direction position measuring interference meters are provided. In FIG. 1, the movement mirror 38 and the reticle laser interference meter 40 are illustrated on behalf of them.

Outputs from the three reticle fine motion laser interference meters are supplied to the main control system 18. The main control system 18 measures the X-position of the reticle fine motion stage 36 based on the output of the X-axis direction position measuring interference meter and computes the Y-position of the reticle fine motion stage 36 based on the average of the outputs of the two Y-axis direction position measuring interference meters, thereby computing the rotation angle on the X and Y-plane of the reticle fine motion stage 36 based on the difference of outputs,between the two Y-axis direction position measuring interference meters.

The projection optical system PL is supported on a base (not shown) through a first column (not shown) such that a direction of its optical axis accords with the Z-axis direction perpendicular to the X and Y-plane. A second column (not shown) is provided on the first column and the reticle base is provided on the second column. A refraction optical system having, for example, a predetermined reduction ratio β (in this embodiment β=¼) at both telecentric is employed as the projection optical system PL. For this reason, the pattern of the slit-shaped illuminated regions in the pattern region of the reticle R is reduced and projected onto the exposure region on the wafer W having a surface coated with photoresist, the exposure region being conjugated with the foregoing illuminated region through the projection optical system PL upon exposure.

Actually, the wafer stage 16 is composed of an XY stage for moving the wafer base (not shown) in an X and Y two dimensional direction, a leveling stage provided on the XY stage, Z·θ stage for holding the wafer, which is provided on the leveling stage. In FIG. 1, the wafer stage 16 representatively is shown on behalf of these components.

The movement mirror 46 is provided on the wafer stage 16. The wafer laser interference meter 48 is provided so as to face the movement mirror 46, which projects a laser beam onto the movement mirror 46 and receives its reflection light, thereby detecting the position of the wafer stage 16. Here, a Y movement mirror having a reflection plane perpendicular to the Y axis direction and an X movement mirror having a reflection plane perpendicular to the X axis direction are actually provided on the wafer stage 16. Corresponding to these mirrors, provided are a Y axis direction position measuring interference meter for receiving the reflection light form the Y movement mirror, a X axis direction position measuring interference meter for receiving the reflection light from the X movement mirror, and a rotation measuring interference meter, that is, three interference meters in total are provided as wafer laser interface meters. In FIG. 1, the movement mirror 46 and the wafer laser interference meter 48 are shown representatively on behalf of these components.

Outputs from the three wafer laser interference meters are supplied to the main control system 18. The main control system 18 measures the X position of the wafer stage 16 based on the output of the X axis direction position measuring interference meter and measures the Y position of the wafer stage 44 based on the output of the Y axis direction position measuring interference meter. The main control system 18 computes the rotation angle on the X and Y-plane of the wafer stage 16 based on the output of the rotation measuring interference meter against the output of the X axis direction position measuring interference meter.

During the exposure operation, the main control system 18 scans, for example, the wafer stage 16 in −Y direction at a scan speed VW (VW=β·VR) through the driving apparatus (not shown) in synchronization with scanning the reticle coarse motion stage 34 in +Y direction at a predetermined scan speed VR through a driving apparatus (not shown) for relative scanning. The main control system absorbs the relative speed error, created at this time, between the reticle coarse motion stage 34 and the wafer stage 16 and controls the operation of the reticle fine motion stage 36 through a driving apparatus (not shown) for the fine motion control in order that the relative speed of the reticle R and the wafer W and their position are 4:1. Thus, in synchronization of the scanning of the reticle R in +Y direction against the slit-shaped illumination region illuminated by the exposure light IL, the wafer W against the exposure region conjugated with the illumination region is scanned in the −Y direction at a speed in accordance with a reduction ratio of the projection optical system PL. The pattern formed on the pattern formation surface of the reticle R is sequentially transferred onto a shot region on the wafer W.

Upon completion of the exposure for one shot region, the main control system 18 moves the wafer stage 16 in a non-scan direction (X direction) by a predetermined distance and performs a stepping operation to an exposure starting position for a next shot. Therefore, the main control system performs the scan exposure, thereby performing the exposure according to the step and scan style.

Moreover; in this embodiment, an acceleration sensor (an acceleration meter) 50 serving as the vibration sensor is provided on the side surface of the projection optical system PL. The vibrations of the projection optical system PL is measured by the acceleration sensor 50, and the measurement values relating to the vibrations are supplied to the main control system 18.

Figure 2:
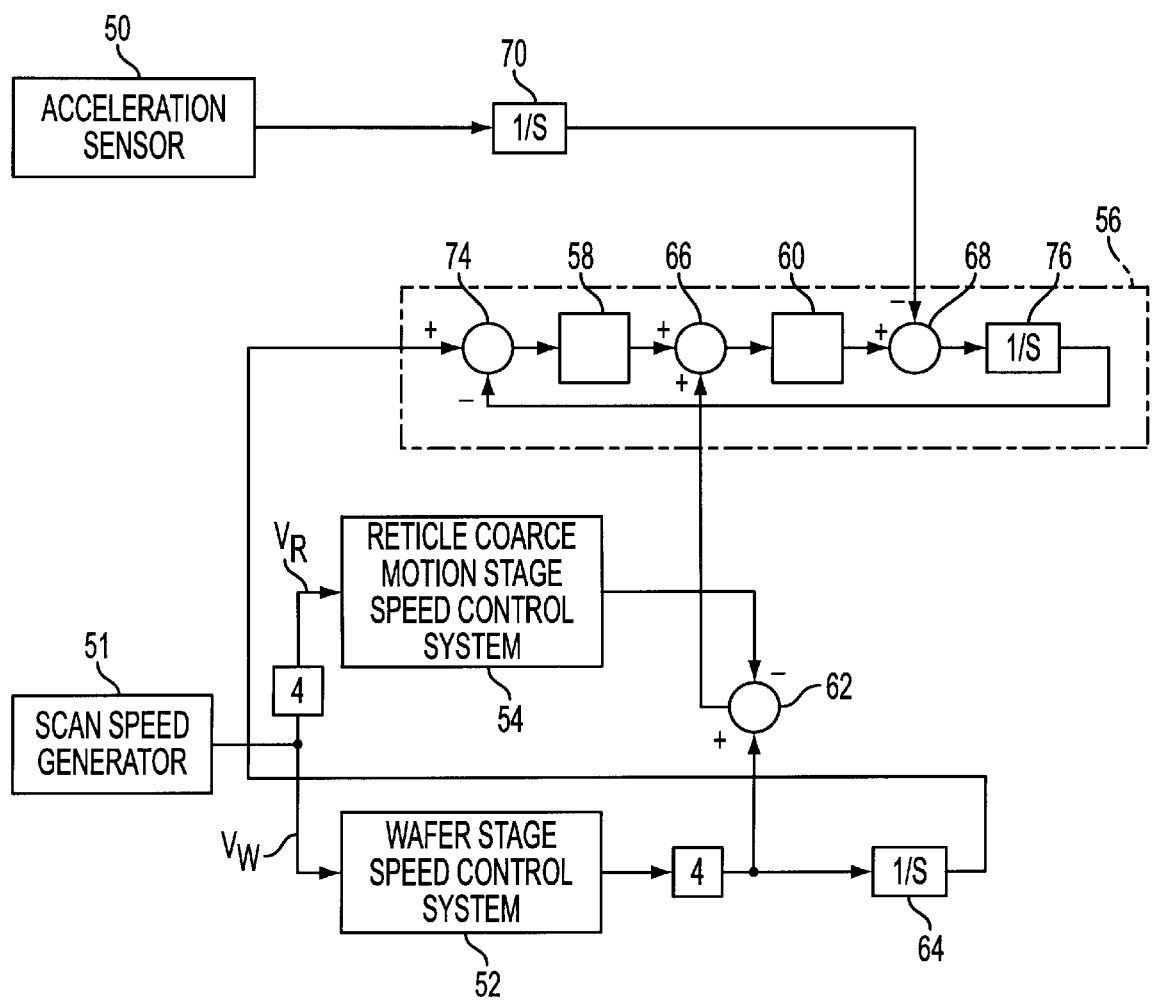
FIG. 2 is a block diagram showing a construction of a stage control system of the apparatus shown in FIG. 1.

FIG. 2 shows a block diagram of a stage control system and a position control system of the scan type exposure apparatus 10 according to this embodiment. The stage control system shown in FIG. 2 shows a function of the main control system 18 of FIG. 1 by a block diagram principally, the function being realized by software. As a matter of course, each of the components of the exposure apparatus may be constituted by each hardware corresponding to the components.

The stage control system comprises a scan speed generator 51 for outputting a speed command value VW for the wafer stage 16 in response to an instruction of a main computer (not shown); a wafer stage speed control system 52 and a reticle coarse motion speed control system 54, which control the speeds of the wafer stage 16 and the reticle coarse motion stage 34 based on the speed command value VW from the scan speed generator 51 and the speed command value VR obtained by multiplying the speed command value VW with 1/β (in this embodiment multiplied by four); and a reticle fine motion stage control system 56 for controlling the position and the speed of the reticle fine motion stage 36 based on position information obtained by multiplying the position of the wafer stage 44 by four.

More specifically, the wafer stage speed control system 52 can be constructed by, for example, I-type closed loop control system including a subtracter (not shown) for computing a speed deviation that is a difference between the speed command value VW and the speed of the wafer stage 16 and a PI controller (not shown) for performing a proportional and integral control operation using the speed deviation form the subtracter as an operational signal. It should be noted that the speed of the wafer stage 16 is actually obtained from the differential value of the measurement values of the wafer laser interference meter 48.

The reticle coarse motion stage speed control system 54 can be constructed by, for example, I-type closed loop control system including a subtracter (not shown) for computing a speed deviation that is a difference between the speed command value VR (=4VW) of the reticle coarse motion stage 34 and a speed of the reticle coarse motion stage 34 and a PI controller (not shown) for performing a proportional and integral control operation using the speed deviation form the subtracter as an operational signal. It should be noted that the speed of the reticle coarse motion stage 34 is actually obtained from the differential value of the measurement values of the reticle coarse motion laser interference meter 42.

The reticle fine motion stage control system 56 can be constructed by composing a subtracter 74 which receives as a target position a value obtained by multiplying the position of the wafer stage by four, which corresponds to the value obtained by multiplying the measurement value of the wafer interference meter 48 by four, the position of the wafer stage being obtained by integrating the value multiplied by β (four) by a first integration circuit 64, which is an output of the wafer stage speed control system 52 and computes the positional deviation that is a difference between the target position and the positional information of the reticle fine motion state 36 which is an output of a second integration circuit 76 later described and corresponds to an output of the reticle fine motion laser interference meter 40; a reticle fine motion stage position control system 58 which includes a PI controller for performing a proportional and integral control operation using the positional deviation as an operational signal, which is an output from the subtracter 74, and converts a control quantity computed by the PI controller to a speed to output it; a reticle fine motion stage speed control system 60 for performing a control operation using an output of the position control system 58 as a target speed; and a second integration circuit 76 which integrates an output of the reticle fine motion stage speed control system 60 to convert it to the position of the reticle fine motion stage. Here, the reticle fine motion stage speed control system 60 is constructed by including a subtracter (not shown) for computing a speed deviation that is a difference between the target speed that is the output of the position control system 58, and a speed of the reticle fine motion stage; and a PI controller (not shown) for performing a proportional and integral control operation using the speed deviation of the subtracter as an operational signal.

In this embodiment, in order to enhance a position control response of the reticle fine motion stage control system 56, the speed error between the wafer stage 16 and the reticle coarse motion stage 34, is feed-forwarded to the reticle fine motion stage speed control system 60 through an adder 66, the speed error being the output of the subtracter 62.

Moreover, in this embodiment, the measurement value of the above described acceleration sensor 50 is integrated by a third integration circuit 70, and the integration value is feed-forwarded to the second integration circuit 76 through the subtracter 68. The positional information of the reticle fine motion stage 36 outputted from the second integration circuit 76 is information relating to the position obtained by integrating the difference between the speed of the reticle fine motion stage 36 and the integration value (speed) of the vibration (acceleration) measured by the acceleration sensor 50, the output of the reticle fine motion stage 36 being an output of the reticle fine motion stage speed control system

60. Specifically, the vibration components of the projection optical system PL, which is a part of the exposure apparatus body, is cancelled by the subtracter 68, the vibration components being measured by the acceleration sensor 50. Errors due to the vibrations of the exposure apparatus body are not included in the measurement value of the position of the reticle fine motion stage 36 that is an output of the second integration circuit 76. Actually, the position of the reticle fine motion stage 36 are directly measured by the reticle fine motion laser interference meter 40 and it is not obtained by integrating the speed of the reticle fine motion stage speed control system 60. In FIG. 2, the control systems equivalent to the actual control systems are illustrated for the convenience of descriptions and according to customs of ways to illustrate the control blocks.

According to the scan type exposure apparatus 10 of this embodiment described above, the vibrations of the projection optical system PL, which is a part of the exposure apparatus body, are measured using the acceleration sensor 50 provided on the side surface of the projection optical system PL. This measurement value is converted to the speed and is feed-forwarded to the reticle fine motion stage control system 56. Therefore, it can be suppressed that the vibration components of the exposure apparatus body have an influence on the measurement value of the reticle fine motion laser interference meter 40 for measuring the position of the reticle fine motion stage 36. Thus, the vibration components of the synchronous errors between the reticle R and the wafer W for the exposure can be speedily cancelled, thereby keeping the image formation characteristic at a high grade.

In this embodiment, since the measurement value of the acceleration sensor 50 is feed-forwarded to the control system 56 for controlling the reticle fine motion stage 36 having the most excellent position control response characteristic, there is an advantage that the synchronous errors between the reticle and the wafer, which is due to the vibrations, can be cancelled at shorter period of time.

Moreover, in this embodiment, since the vibrations of the projection optical system PL are directly measured by the acceleration sensor 50, it will be possible to remove the vibration components of the synchronous errors most significantly reflecting influences given to the image formation characteristic of the projection optical system PL by the vibrations of the exposure apparatus body, so that the image formation characteristic of the projection optical system PL can be kept at the highest grade. From such view point, it is desirable to measure the vibrations at the pupil position of the projection optical system PL by the acceleration sensor. Moreover, alternately, a plurality of acceleration sensors may be fitted to the projection optical system PL, and the measurement values of these acceleration sensors may be subjected to a predetermined computational processing, thereby detecting the vibrations of the projection optical system PL.

However, it is sufficient that the vibration sensor is provided partially on the exposure apparatus body other than projection optical system PL, except for the foregoing water stage and the foregoing reticle stage, and then the vibrations of the exposure apparatus body can be measured. As a matter of course, the vibrations of the projection optical system PL is not necessarily required to be measured.

In the above described embodiment, the measurement value of the acceleration sensor 50 is feed-forwarded to a part of the position control loop within the reticle fine motion stage control system 56. The present invention is not limited to this, and the measurement value may be feed-forwarded to other portions of the position control system such as the inside of the speed control system 60 within the reticle fine motion stage control system 56. Alternately, the measurement value may be feed-forwarded to other portions of the stage control system of FIG. 2 such as the wafer stage speed control system 52 and the reticle coarse fine motion stage speed control system 54.

In the above described embodiment, the case where the present invention is applied to the scan exposure apparatus of a step and scan type was described. The scope of the present invention is not limited to this, and the present invention may be applied to an exposure apparatus of a static exposure type such as a reduction projection exposure type apparatus of a step and repeat type (a stepper). Specifically, even the exposure apparatus of a static exposure type, a mask stage and a wafer stage are provided, and at least the position of the wafer stage is directly measured by the laser interference meter. Since it is considered that the vibration components of the exposure apparatus body have an influence on the measurement value, by inputting the measurement value of the vibration sensor to the stage control system for controlling the wafer stage in a feed-forward fashion, the errors due to the vibrations included in the measurement value of the laser interference meter can be cancelled by the measurement value of the vibration sensor before the errors due to the vibration has an effect on the control object composed of the stage control system. Therefore, it is possible to prevent the occurrence of the positional deviation between the reticle stage and the substrate stage, so that the projection exposure can be performed while keeping the desired image formation relation between the reticle and the wafer.

Moreover, the embodiments can be applied to an exposure apparatus of a proximity type other than the projection exposure apparatus as well as an exposure apparatus such as an electron beam exposure apparatus. Also in these exposure apparatuses, the positional alignment of the mask with the photosensitive substrate is inevitable. Therefore, the position of at least one of the mask and the photosensitive substrate is directly measured by the measuring means such as the laser interference meter. Since it is considered that the vibration components of the exposure apparatus body have an effect on this measurement value by the measuring means, the vibrations of the portions other than those the positions of which are measured by the vibration sensor are measured by the measuring means disposed within the mask and the photosensitive substrate in the exposure apparatus body. The position of at least one of the mask and the photosensitive substrate is controlled by the position control system, based on the measurement value of the vibration sensor and the measurement value of the measuring means, thereby suppressing the occurrence of faulty exposures due the positional deviation between the mask and the photosensitive substrate.

Futher the above embodiment provide an exposure apparatus which performs a projection exposure for a pattern formed on a mask (R) onto a photosensitive substrate (W) through a projection optical system (PL), comprises: a mask stage (14) for holding the mask (R); a substrate stage (16) for holding the photosensitive stage (W); measuring means (40) for directly measuring a position of either the mask stage (14) or the substrate stage (16); a vibration sensor (50) for measuring the vibrations in the exposure apparatus body as well as a portion other than either the mask stage (14) or the substrate stage (16); and a stage control system (18) for controlling either the mask stage (14) or the substrate stage

(16) based on the measurement values which are feed-forwarded from the vibration sensor (50) as well as the measurement values of the measuring means (40).

According to the construction of the exposure apparatus of the embodiment, when the vibrations are caused in the exposure apparatus body during the projection exposure operation of the mask pattern onto the photosensitive substrate using, for example, the projection optical system, the vibrations at the portion are measured by the vibration sensor that the portion being other than portions the positions of which are measured by the measuring means in either the mask stage or the substrate stage. The measurement values of the vibration sensor are feed-forwarded to the stage control system. The stage control system controls either the mask stage or the substrate stage based on the measurement values of the measuring means and the measurement values of the vibration sensor inputted thereto. In this case, since the measurement values of the vibration sensor are feed-forwarded to the stage control system, the stage control system will be capable of canceling the vibration components included in the measurement values of the measuring means by the measurement values of the vibration sensor before the vibration components affect great influences on its control object. The position of either the mask stage or the substrate stage is controlled under the conditions where no errors due to the vibrations exist, whereby the positional deviation between the mask and the photosensitive substrate can be prevented. Thus, the projection exposure will be implemented while keeping the mask and the photosensitive substrate at a desired image formation relation.

In the construction of the above embodiment, a scan type exposure apparatus the mask stage (14) and the substrate stage (16) of the scan type exposure apparatus are subjected to a scanning at a predetermined speed ratio relative to the projection optical system (PL) by the stage control system.

In the conventional scan type exposure apparatus, when vibrations are caused in the exposure apparatus body, the vibrations cause errors (vibration errors) in the measurement values of the measuring means (40). As a result, the synchronous error occurs in both of the stages (14) and (16), resulting in the deterioration of the image formation characteristic. Since the measurement values of the vibration sensor (50) are feed-forwarded to the stage control system (18) in the present invention, it will be possible to cancel the vibration components of the synchronous error occurred between both stages speedily. The image formation characteristic can be maintained in a good state.

In the above embodiment, an exposure apparatus, in which at least one of the mask stage (14) and the substrate stage (16) is composed of a coarse motion state (34) and a fine motion stage (36) moving relatively on the coarse motion stage (34), the stage control system (18) controls a position of the fine motion stage (36) based on the measurement values which are feed-forwarded from the vibration sensor (50) and the measurement values of the measuring means (40), is provided.

In case of the exposure apparatus comprising a projection optical system, since the vibrations of the apparatus body have an effect on the image formation characteristic of the projection optical system, the vibrations in the portion relating to the image formation characteristic of this projection optical system should be preferably detected. In the foregoing exposure apparatus, for example, the foregoing vibration sensor may be designed such that it measures the vibrations of the foregoing projection optical system (PL).

An another embodiment according to the present invention will be explained referring to FIGS. 3–5.

Figure 3:
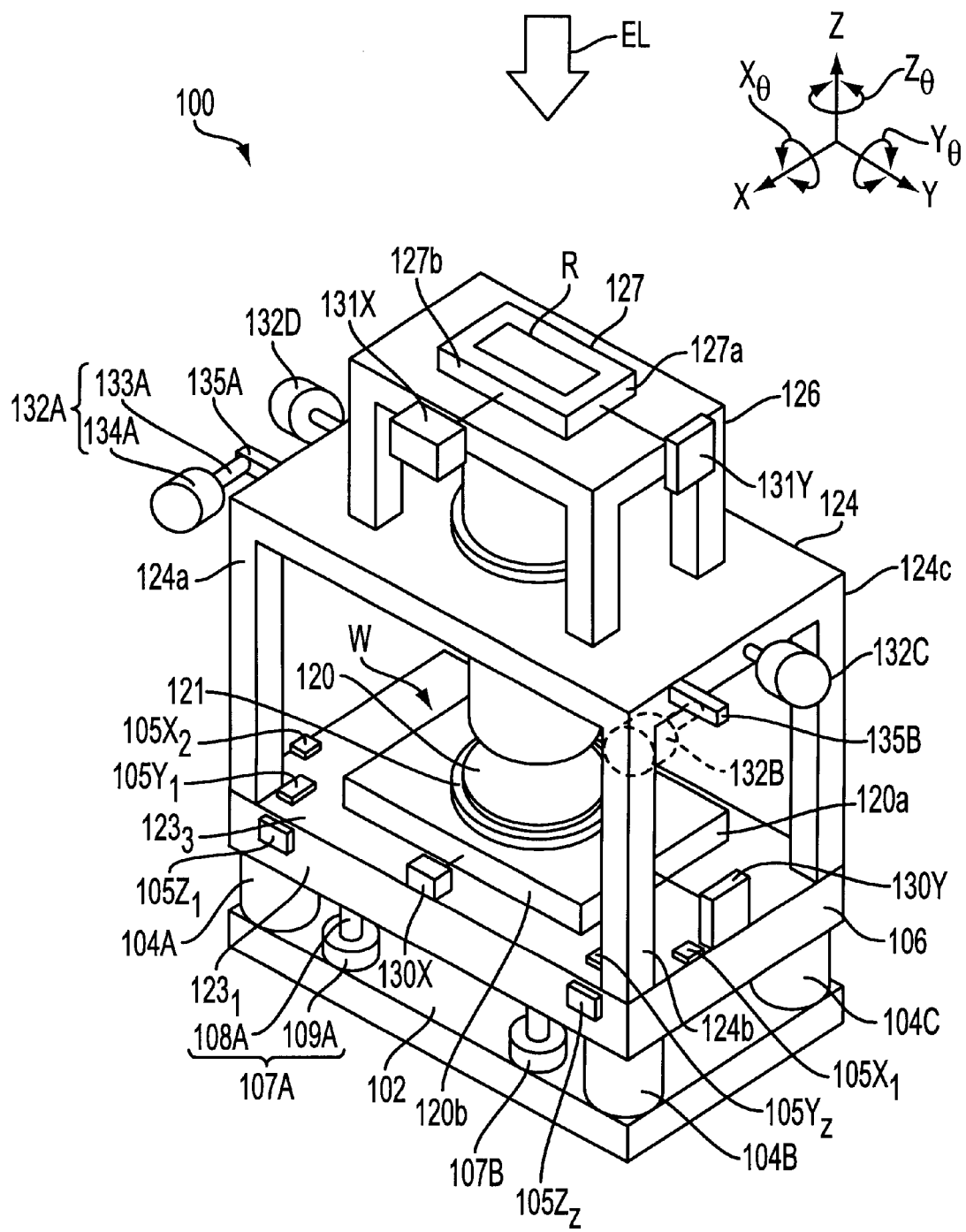
FIG. 3 is a perspective view showing an outline of a projection exposure apparatus according to an embodiment of the present invention.

FIG. 3 is a schematic perspective view of a projection exposure apparatus 100 of a step and scan type that is another embodiment of the present invention. In FIG. 3, a pedestal 102 of a rectangular plate shape is set on a floor as a setup plane, and vibration removing pads 104A to 104D are set on the pedestal 102. It should be noted that the pad 104D located at the innermost position is not shown in FIG. 3. A base 106 is set up of a rectangular shape on the pads 104A to 104D. Since a projection optical system PL is used in this embodiment as is described later, a Z-axis is taken in parallel with an optical axis of the projection optical system PL, a Y-axis is taken in the longitudinal direction of the base 106 on a plane perpendicular to the Z-axis, and an X-axis is taken in a direction perpendicular to the Y-axis. Rotation directions around the axes are determined as $Z\theta$, $Y\theta$ and $z\theta$, respectively. In the following descriptions, the directions illustrated by the arrows of the X, Y and Z-axes in FIG. 3 are +Y, +Y and +Z directions, and the opposite directions to those are −X, −Y and −Z directions.

The vibration removal pads 104A to 104D are disposed close to the four corners of the rectangular bottom surface of the base 106, respectively. In this embodiment, a pneumatic damper is used as the vibration removal pads 104A to 104D, so that the height of the pads 104A to 104D can be adjusted by air pressure. Therefore, the pneumatic dampers serve also as a vertically moving mechanism. As a matter of course, another vertical moving mechanism may be provided and the vibration removal pads such as a mechanical damper in which a compression coil spring is provided in the damping liquid may be used.

An actuator 107A is provided between the pedestal 102 and the base 106 that is parallel with the vibration removal pad 104A. A voice coil motor is used, which is composed of a stator 109A formed of a magnetic field generator fixed onto the pedestal 2 and rotator 108A fixed to the bottom surface of the base 106,as an actuator 107A. The actuator 107A generates an energizing force in the Z-axis direction, which acts from the pedestal 102 to the bottom surface of the base 106, and absorption force which acts from the bottom surface of the base 106 to the pedestal 102 by controlling currents flowing the coil in the rotator 108A by an actuator controlling circuit 111, which will be described later (refer to FIGS. 4 and 5).

Also in other vibration removal pads 104B to 104D, similar to the vibration removal pad 104A, actuators 107B to 107D having the same constitution as that of the actuator 107A are provided in parallel. It should be noted that the actuators 107C and 107D located at the innermost positions are not shown in FIG. 3. The energizing force and the absorption force of these actuators 107B to 107D are set by a later described actuator control circuit 111 (see FIGS. 4 and 5). A control method of the actuators 107A to 107D will be described later.

Onto the side surface of the base 106 in the +X direction, the acceleration sensors 105Z1 and 105Z2 serving as the vibration sensor for detecting the Z direction acceleration of the base 106 are fitted. Moreover, the acceleration sensors 105Y1 and 105Y2 serving as the vibration sensor for detecting the Y direction acceleration of the base 106 are fitted to the +X direction end on the upper surface of the base 106. The acceleration sensors 105X1 and 105X2 serving as the vibration sensor for detecting the X direction acceleration of the base 106 are fitted to the +Y and −Y direction ends on the upper surface of the base 106. For example, a semiconductor acceleration sensor is employed as the acceleration sensors 105Z1, 105Z2, 105Y1, 105Y2, 105X1 and 105X2. Outputs from these acceleration sensors 105Z1, 105Z2, 105Y1, 105Y2, 105X1 and 105X2 are supplied to a later described vibration control computing circuit 154 (see FIGS. 4 and 5).

The wafer stage 120 serving as the second stage is mounted on the base 106. As shown in FIG. 4, the wafer stage 120 actually consists of an X stage 120X driven in the X direction along the upper surface of the base 106 by a linear motor (not shown); a Y stage 120Y mounted on the X stage 120X, which is driven in the Y direction by a linear motor not shown); and a Z leveling stage 120Z mounted on the Y stage 120Y. In FIG. 3, the wafer stage 120 is shown representatively on behalf of them. The wafer stage 120 is constructed such that a wafer W as a substrate is held on a leveling stage 120Z by absorption through a wafer holder 121 which is able to perform a fine rotation in the θ direction.

Moreover, the first column 124 is provided on the base 106 so as to surround the wafer stage 120. The projection optical system PL is fixed to the central portion of the upper plate of the first column 124. The second column 126 is provided on the upper plate of the first column 124 so as to surround the projection optical system PL. The reticle stage 127 as the first stage is mounted on the upper plate of the second column 126, and the reticle R as the mask is mounted on the reticle stage 127.

The side surfaces of the wafer stage 120 (actually leveling stage 20Z) in the +Y and +X directions are subjected to a mirror polishing treatment so that the reflection planes 120a and 102b as the second reflection mirror are formed. The movement positions of the wafer stage 120 in the X and Y directions are measured by the wafer X and Y axis interference meters 130X and 130Y through these reflection planes 120a and 120b. This is described later. The wafer X and Y axis interference meters 130X and 130Y are hereinafter referred to as a wafer interference meter 130. The Z leveling stage 120Z is constituted such that its drive in the Z axis direction and its slant against the X and Y plane are adjustable. Therefore, the wafer W can be positioned three dimensionally by the X stage 120X, the Y stage 120Y, the Z leveling stage 120Z and the wafer holder 121.

The reticle stage 127 is constituted so that the reticle R can be finely adjusted in the X-axis direction and the angle of rotation of the reticle R can be adjusted. The reticle stage 127 is also adapted so that it may be driven in the Y direction by a linear motor (not shown). The +Y direction and +X direction side surfaces of the reticle stage 127 are planished so that reflecting surfaces 127a, 127b may be formed as a first reflecting mirror. The position of movement of the reticle stage 127 in the Y direction and the X direction is measured by a reticle Y-axis interference meter 131Y and a reticle X-axis interference meter 131X (hereinafter, sometimes generally referred to as "a reticle interference meter 131") through the reflecting surfaces 127a, 127b (described below in detail).

An illumination optical system (not shown) is also arranged over the reticle R. A control apparatus 142 described below (see FIGS. 4 and 5) performs a relative alignment of the reticle R and the wafer w and allows a focal point detecting system (not shown) to perform an autofocus, while the pattern of the reticle R is subsequently exposed onto each shot region on the wafer W through the projection optical system PL under an exposing light EL from the illumination optical system. In the second embodiment, during the exposure on each shot region, the wafer stage 120 and the reticle stage 127 are relatively scanned in the opposite directions each other at a predetermined ratio of speed along the Y-axis direction (scan direction) through the linear motor (not shown) by respective stage controlling circuits (described below) in response to an instruction from the control apparatus 142.

The first column 124 is in contact with a fixed platen 106 by four legs 124a–124d (it should be noted that the leg 124d located on that side of FIG. 3 is not shown). A movable shaft 135A is also embedded in the side surface of the first column 124 in the −Y direction. An actuator 132A is mounted between the movable shaft 135A and the column (not shown) fixed on a floor.

A voice coil motor comprising a stator 134A composed of a magnetic field generating material fixed by the column (not shown) and a mover 133A including a coil mounted to the movable shaft 135A is used as the actuator 132A in the same manner as the actuator 107A. The current flowing through the coil in the mover 133A is adjusted by an actuator control circuit 111 described below, whereby the actuator 132A can apply the force to the movable shaft 135A in the ±X direction. In the same manner, a movable shaft 135B is embedded in the side surface of the first column 124 in the +Y direction. An actuator 132B of the same constitution as the actuator 132A is mounted between the movable shaft 135B and the column (not shown) fixed on the floor. The actuator 132B is controlled by the actuator control circuit 111 described below, whereby the actuator 132B can apply the force to the movable shaft 135B in the ±X direction.

An actuator 132C of the same constitution as the actuator 132A is also mounted between the center on the +Y direction side surface of the first column 124 and the column (not shown) fixed on the floor. The actuator 132C is controlled by the actuator control circuit 111 described below, whereby the force can be applied to the first column 124 in the ±Y direction through the actuator 132C. In the same manner, an actuator 132D of the same constitution as the actuator 132A is also mounted between the center on the −Y direction side surface of the first column 124 and the column (not shown) fixed on the floor. The actuator 132D is controlled by the actuator control circuit 111 described below, whereby the force can be applied to the first column 124 in the ±Y direction through the actuator 132D. A method of controlling these actuators 132A–132D will be described below.

Figure 4:
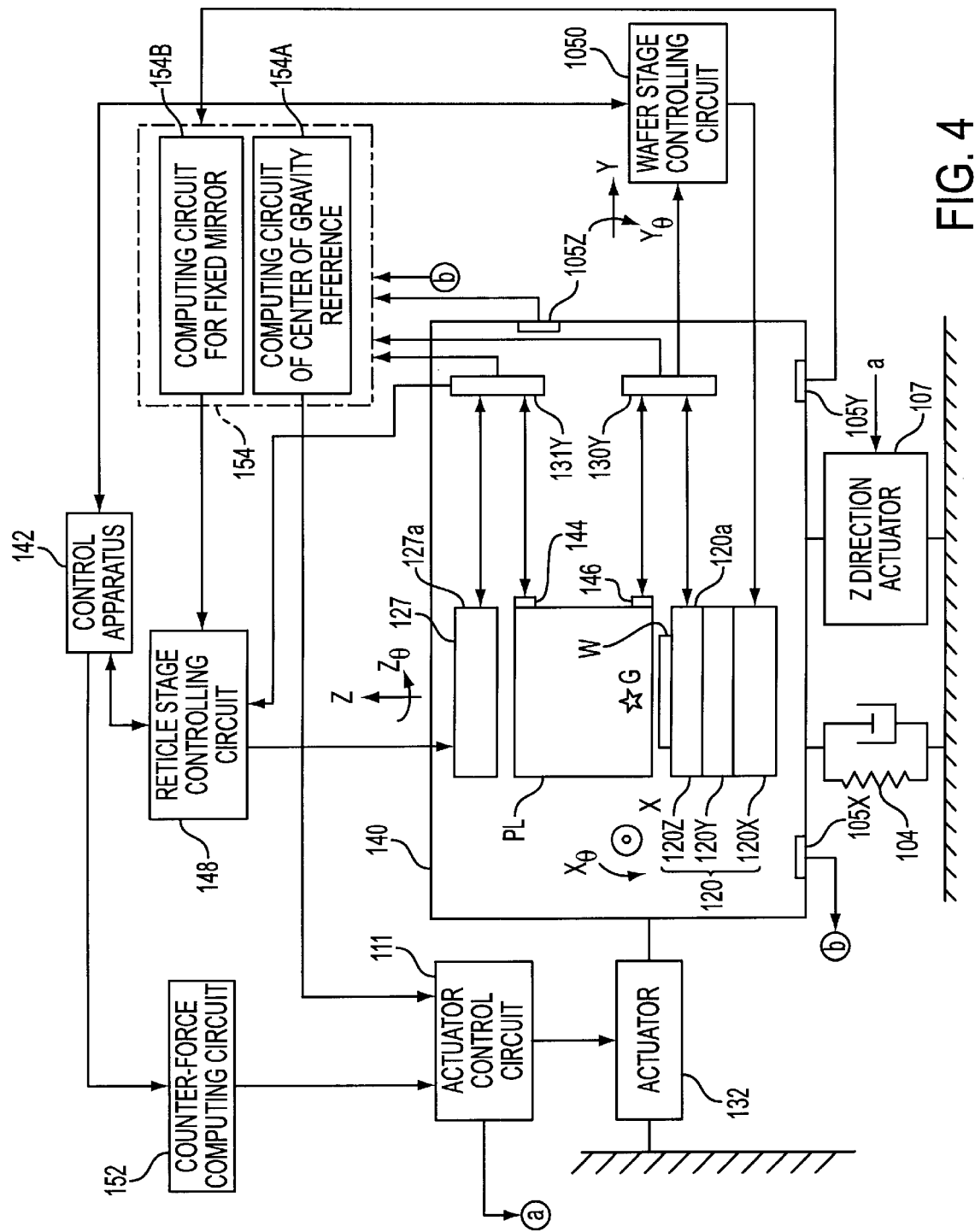
FIG. 4 is a diagram showing a construction of a vibration control system for the exposure apparatus body.

FIG. 4 shows the constitution of a vibration control system for an exposing apparatus body 140 constituting the projecting/exposing apparatus 100 together with the exposing apparatus body 140 to be controlled by the vibration control system. Herein, the exposing apparatus body 140 is an element comprising the above-described fixed platen 106 of FIG. 3, the body composed of the first column 124 and the second column 126, the wafer stage 120 mounted on the body, the projection optical system PL, the reticle stage 127 or the like.

As described above, the exposing apparatus body 140 is supported from the lower portion by four vibration removing pads 104A–104D and four Z-direction actuators 107A–107D. Referring to FIG. 4, the vibration removing pads 104A–104D and the Z-direction actuators 107A–107D are generally shown as a vibration removing pad 104 and a Z-direction actuator 107, respectively. The exposing apparatus body 140 is also supported by two Y-direction actuators 132C, 132D for controlling the vibration in the Y-direction and two X-direction actuators 132A, 132B for controlling the vibration in the X-direction. Referring to FIG. 4, these four actuators are generally shown as an actuator 132.

The exposing apparatus body 140 is also provided with total six acceleration sensors including two acceleration sensors 105X$_1$, 105X$_2$ for measuring the acceleration in the X direction arranged spatially apart from each other on the fixed platen 106, two acceleration sensors 105Y$_1$, 105Y$_2$ for measuring the acceleration in the Y direction arranged spatially apart from each other on the fixed platen 106 in the same manner and two acceleration sensors 105Z$_1$, 105Z$_2$ for measuring the acceleration in the Z direction arranged spatially apart from each other on the fixed platen 106 in the same manner. Referring to FIG. 4, the acceleration sensors 105X$_1$, 105X$_2$, the acceleration sensors 105Y$_1$, 105Y$_2$ and the acceleration sensors 105Z$_1$, 105Z$_2$ are generally shown as an acceleration sensor 105X, an acceleration sensor 105Y and an acceleration sensor 105Z, respectively.

A measurement of the position of the reticle stage 127 and the wafer stage 120 will be described with reference to FIG. 4.

The reflecting surface 127a is formed on the +Y direction side surface of the reticle stage 127 as described above. A fixed mirror 144 is fixed on the upper outer periphery of the projection optical system PL so that it may be used as a third reflecting mirror. A helium neon laser light is emitted from the reticle Y-axis interference meter 131Y toward the reflecting surface 120a and the fixed mirror 144, so that the Y direction position of the reticle R placed on the reticle stage 127 is measured on the basis of the fixed mirror 144 by the reticle Y-axis interference meter 131Y.

As described above, the reflecting surface 120a is formed on the +Y direction side surface of the leveling stage 120Z constituting the wafer stage 120. A fixed mirror 146 is fixed on the lower outer periphery of the projection optical system PL so that it may be used as the third reflecting mirror. The helium neon laser light is emitted from the wafer Y-axis interference meter 130Y toward the reflecting surface 120a and the fixed mirror 146, so that the Y direction position of the wafer W placed on the wafer stage 120 is measured on the basis of the fixed mirror 146 by the wafer Y-axis interference meter 130Y.

Although the measurement of the Y direction position of the reticle R and the wafer W alone is herein described, the X direction position of the reticle R and the wafer W is also measured by the above-described reticle X-axis interference meter 131X and wafer X-axis interference meter 130X for measuring the position in the X direction.

The constitution of the vibration control system for the exposing apparatus body 140 will be described below with reference to FIG. 4 and FIG. 5 (the drawing showing the detailed constitution of each portion of FIG. 4). As shown in FIG. 4, this control system comprises a control apparatus 142 for generally controlling the whole apparatus, a reticle stage controlling circuit 148, a wafer stage controlling circuit 150, a counter-force computing circuit 152, a vibration control computing circuit 154, and an actuator control circuit 111 or the like.

In the second embodiment, stage motion signal output means comprises the control apparatus 142, stage control means comprises the reticle stage controlling circuit 148, counter-force computing means comprises the counter-force computing circuit 152, and vibration control computing means comprises the vibration control computing circuit 154.

The vibration control computing circuit 154 comprises a computing circuit of center of gravity reference 154A for computing the vibration on the basis of a position of center of gravity G as the center of vibration of the exposing apparatus body 140 and a computing circuit for fixed mirror 154B for computing the vibration on the basis of the fixed mirror for the reticle (the fixed mirror 144 shown in FIG. 2 and the X-axis fixed mirror not shown: hereinafter generally referred to as "the fixed mirror 144").

The computing circuit of center of gravity reference 154A has a function for determining the vibration in the directions of six degrees of freedom (X, Y, Z, X, Y, Z) in the position of center of gravity G of the exposing apparatus body 140 by performing a predetermined matrix computation in accordance with outputs of the six acceleration sensors 105X$_1$, 105X$_2$, 105Y$_1$, 105Y$_2$, 105Z$_1$, 105Z$_2$. The position of center of gravity G of the exposing apparatus body 140 is previously defined in design. The positions of the six acceleration sensors 105X$_1$, 105X$_2$, 105Y$_1$, 105Y$_2$, 105Z$_1$, 105Z$_2$ are also previously defined. Therefore, it is easy to determine the vibration in the directions of six degrees of freedom in the position of center of gravity G of the exposing apparatus body 140 by performing a predetermined matrix computation in accordance with the outputs of the six acceleration sensors 105X$_1$, 105X$_2$, 105Y$_1$, 105Y$_2$, 105Z$_1$, 105Z$_2$. Since the position of center of gravity G of the exposing apparatus body 140 is varied by the movement of the reticle stage 127 and the wafer stage 120, this fact is taken into consideration in the second embodiment. That is, coefficients of the matrix computation are previously determined in response to the positions of the reticle stage 127 and the wafer stage 120 by a simulation experiment or the like, the coefficients of the matrix computation are then stored as map data in a memory in the computing circuit of center of gravity reference 154A, and the values measured by the reticle interference meter 131 and the wafer interference meter 130 are also supplied to the computing circuit of center of gravity reference 154A. Since there are also provided eight actuators 107A–107D, 132A–132D in the second embodiment, the computing circuit 154A performs the matrix computation for further assigning the vibration in the directions of six degrees of freedom in the position of center of gravity G of the exposing apparatus body 140 to the eight actuators, whereby a feed back signal is supplied to each actuator through the actuator control circuit 111.

The computing circuit for fixed mirror 154B has a function for determining the vibration in the directions of two degrees of freedom in the XY directions on the basis of the fixed mirror 144 by performing a predetermined matrix computation in accordance with the outputs of the six acceleration sensors 105X$_1$, 105X$_2$, 105Y$_1$, 105Y$_2$, 105Z$_1$, 105Z$_2$. The position of the fixed mirror 144 for the reticle is previously defined in design. The positions of the six acceleration sensors are also previously defined. Therefore, it is possible to easily determine the matrix coefficients for converting the signal obtained by the six acceleration sensors into the vibration of the fixed mirror 144 for the reticle in the XY directions. The computing circuit for fixed mirror 154B determines the vibration of the fixed mirror 144 as a reference position of the reticle R in the XY directions by the computation, and the computing circuit 154B supplies the computation result to the reticle stage controlling circuit 148. The measurement values of the reticle interference meter 131 and the wafer interference meter 130 are supplied to the foregoing control apparatus 142 through the reticle stage controlling circuit 48 and the wafer stage controlling circuit 50 (see FIG. 4). In the controlling apparatus 142, the positions, speeds and accelerations of the X stage 120X, Y stage 120Y and reticle stage 127 are managed to be controlled. Specifically, as shown in FIG. 5, in the controlling apparatus 142, the instruction values of the positions, speeds and accelerations for the stages are computed. The instruction values of the positions of the stages are deemed as the target values for the stage controlling circuits 148 and 150. At the same time, the instruction values of the speeds and accelerations are inputted to the stage control system in the stage controlling circuits 148 and 150 in a feed-forward fashion as described later.

Figure 5:
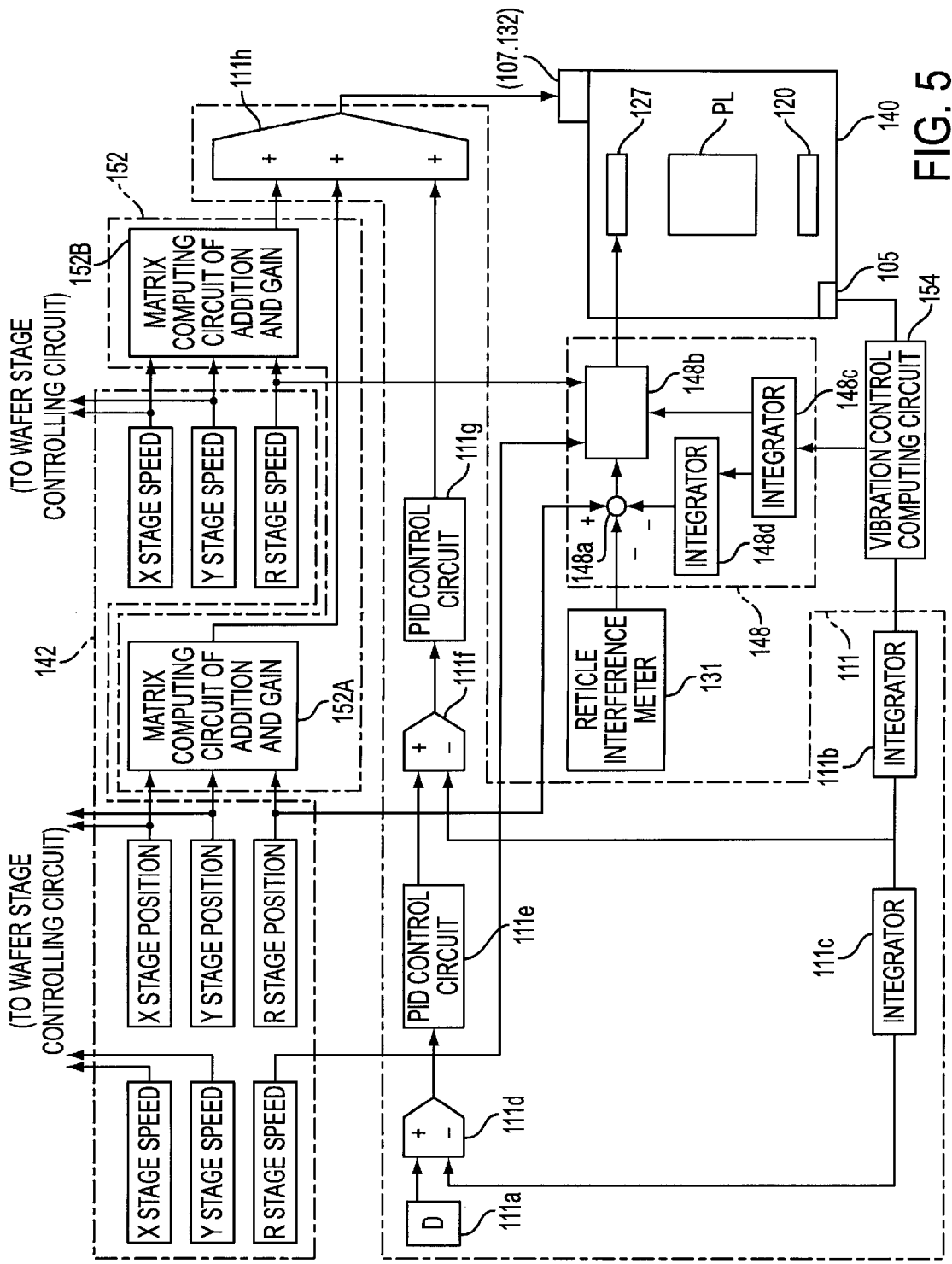
FIG. 5 is a diagram showing a detailed construction of each portion of the diagram of FIG. 4.

The reticle controlling circuit 148 as shown in FIG. 5, comprises a subtractor 148a for computing a positional deviation that is a difference between the instruction value of the reticle stage (R stage) from the controlling apparatus 142 and the measurement value of the reticle interference meter 130; and a stage controlling system 148b for performing (proportion+integration) controlling operation using the positional deviation as an operational signal and computing the controlling quantity so as to make the positional deviation zero, thereby giving a thrusting force to the reticle stage 127 through a linear motor (not shown). It should be noted that a speed controlling loop (not shown) is built in the stage controlling system 148b. The whole of the system to control the reticle stage 127 is a multi loop controlling system having a speed loop as an internal loop for the positional loop.

Here, the instruction value of the speed is inputted in the feed-forward fashion from the controlling apparatus 142 to the speed controlling loop within the stage controlling system 148b. Moreover, the instruction value of the acceleration from the controlling apparatus 142 is converted into the thrust force and inputted in the feed-forward fashion to the output terminal of the PI controller constituting the speed controlling loop. As described above, the reason why the instruction values of the speed and acceleration are supplied in the feed-forward fashion from the controlling apparatus 142 to the reticle stage controlling circuit 148 in addition to the control by the positional loop based on the instruction value of the position is as follows;specifically, since in the scanning (scan-type) exposure apparatus it is most important to control the speed of the stage, the position control responsibility of the whole system must be enhanced in order to produce the compatibility of the positional controlling with the speed controlling and the like.

Moreover, in the second embodiment, the acceleration signal (information concerning vibrations) in the X and Y two freedom degree directions in the fixed mirror 144 is supplied to the reticle stage controlling circuit 148 as a feedback signal. This acceleration signal is fed back to the speed controlling loop within the stage controlling system 148b through the integrator 148c. At the same time, the output from integrator 148c is fed back to adder 148a of the positional controlling loop through another integrator 148d. As described above, the reason why the acceleration signal in the X and Y two freedom degree directions is supplied as the feedback signal to the positional controlling loop and speed controlling loop constituting the controlling system of the reticle stage 127 is as follows.

As described above, since the position of the reticle R is measured by the reticle interference meter 131 using the position of the fixed mirror 144 as a reference, by applying the vibrations in the X and Y directions in the fixed mirror 144, the residual vibrations later described are present in the exposure apparatus body 140 and though the measurement errors are produced originating from such vibrations, the stage controlling circuit 148 controls the movement of the reticle stage 127 so as to remove such errors, while addiing the residual vibrations. Thus, the position where the pattern of the reticle R is transferred will never varied though the vibrations are in the X and Y directions.

Moreover, the wafer stage controlling circuit 150 comprises a subtracter for computing the positional deviation that is a difference between the instruction value (X and Y two freedom degree directions) of the position from the controlling apparatus 142 and the wafer interference meter 131; and a stage control system for performing a (proportional and integral) controlling operation using the positional deviation as an operational signal and computing the controlling quantity so as to make the positional deviation zero to applying a thrust force to the wafer stage 120 through the linear motor (not shown). The speed instruction values for the X stage 120X and the Y stage 120Y are applied in the teed forward fashion to the speed control loop in the stage controlling system. Similarly, the acceleration instruction values for the X stage 120X and Y stage 120Y are converted to the thrust forces and inputted in the feed forward fashion to the output terminal of the PI controller constituting the speed controlling loop.

The foregoing counter force computation circuit 152 is a circuit which performs a computation in order to produce forces (counter forces) reverse to the variations in the six freedom degree directions of the exposure apparatus 140 in the actuators and input them to the actuator controlling circuit 152 in the feed forward fashion. As shown in FIG. 5, the counter force circuit 152 comprises a first addition and gain matrix computation circuit 152A (hereinafter referred to as "a first matrix circuit") which adds the instruction values of the positions of the reticle stage 127 and the wafer stage 120 from the controlling apparatus 142, performs a gain adjustment and computes rates of the forces to be applied to the actuators; and a second addition and gain matrix computation circuit 152B (hereinafter referred to as "a second matrix computation circuit") which adds the instruction values of the acceleration of the reticle stage 127 and the wafer stage 120, performs a gain adjustment and computes rates of the forces to be applied to the actuators.

The first matrix computation circuit 152A obtains the influence by the variation of the center of gravity due to the stage movement based on the positional instruction values of the stages (R stage 127, X stage 120X and Y stage 120Y) and computes the instruction value of the counter force so as to cancel the variation of the center of gravity. The second matrix computation circuit 152B obtains the reactive force based on the instruction value of the acceleration of the stage, and computes the instruction value of the counter force so as to cancel the reactive force. The instruction values of the counter forces computed by the first and second matrix computation circuits 152A and 152B are inputted in the feed forward fashion to the adder 111h constituting the actuator controlling circuit 111.

As shown in FIG. 5, the actuator controlling circuit 111 comprises a susbtractor 111d which computes a positional deviation (six freedom degree directions) that is a difference between a target position in the six freedom degree directions (here an original (0,0,0,0,0,0) is the target position) output from the target position output section 111a and the positional information which is obtained by integrating twice the acceleration signal using the integrators 111b and 111c, which is said acceleration instruction signal being in a six freedom degree directions in the center of gravity G of the exposure apparatus body 140 computed by the computing circuit 154A at the center of gravity of the vibration controlling computing circuit 154; a PID controlling circuit 111e which performs (proportion+integration+differentiation) controlling operation using the position deviation as an operational signal, output from the substractor 111d and computes the speed instruction value (six freedom degree directions); a substractor 111f which computes a speed deviation (six freedom degree directions) that is a difference between the speed instruction value from the PID controlling circuit and the speed information (six freedom degree directions) obtained by integrating the acceleration signal in the six freedom degree directions in the center of gravity G of the exposure apparatus body 140, which is said acceleration signal being computed by the computation circuit 154A; a PID controlling circuit 111g which performs a (proportion+integration+differentiation) controlling operation using the speed deviation output from the subtractor 111f as an operation signal and computes the instruction value of the force for the actuators; and an adder 111h to which the instruction of value of the force from the PID controlling circuit 111g. Also the instruction values of the counter forces from the matrix computation circuits 152A and 152B are inputted in a feed-forward fashion to the adder 111h as described above.

Next, an operation of the projection exposure apparatus 100 constituted as above during the scan exposure will be described.

In the projection exposure apparatus 100, an predetermined slit-shaped illumination region (the illumination region being defined by a blind in the illumination optical system) on the reticle R is illuminated with a uniform illuminance by an exposure illumination light EL from an illumination optical system (not shown) during the exposure operation. In synchronization with that the reticle R which is scanned in a predetermined scan direction for the illumination region, the wafer W is scanned against a conjugated exposure region with the illumination region relative to the projection optical system PL. Thus, the illumination light EL transmitting through the pattern region of the reticle R is reduced to a predetermined magnification by the projection optical system PL and irradiated onto the wafer W coated with resist. The pattern of the reticle R is sequentially transferred on the exposure region on the wafer W so that the entire surface of the pattern region on the reticle R is transferred onto the shot region on the wafer W by one scanning.

In the step and scan type projection exposure apparatus 100, the signals of the instruction values are sent to the stage controlling circuits 148 and 150, which are said signals being for scanning the reticle stage 127 in the Y-direction at a speed of $\beta V$ by the controlling apparatus 142 ($1/\beta$: a reduced magnification of the projection optical system PL) and for synchronously scanning the wafer stage 120 in −Y-direction at a speed V. The respective controlling circuits 148 and 150 control so as to scan the reticle stage 127 and the wafer stage 120 at predetermined positions and at predetermined speeds, while monitoring the measurement values of the interference meters 130 and 131.

In this case, since the reticle stage 127 and the wafer stage 120 are scanned by the linear motor as described above, accompanied with an increase and reduction in a speed when the reticle stage 127 and the wafer stage 120 removed, a reactive force originating the movements of them is produced in the linear motor so that vibrations are produced in the exposure apparatus body 140 by the reactive force. Moreover, when the reticle stage 127 and the wafer stage 120 are scanned, the variation of the center of gravity of the exposure apparatus body 140 creates a subtle inclination so that vibrations are caused in the whole of the exposure apparatus body 140.

In the second embodiment, as described above, based on the instruction values of the position and acceleration for the reticle stage 127 and the wafer stage 120 from the controlling apparatus 142, the instruction value of the counter force so as to cancel the influence by the variation of the center of gravity due to the stage movements is computed by the counter force computation circuit 152, as well as the instruction value of the counter force so as to cancel the reactive force due to the acceleration. The computed instruction values are supplied to the actuators 107A to 170D, 132A to 132D) through the actuator controlling circuit 111 in the feed forward fashion. For this reason, the reactive force produced by the increase and reduction in a speed of the reticle stage 127 and the wafer stage 120 is principally canceled by a force generated by each actuator driven according to the instruction value of the counter force. The vibrations of the exposure apparatus body 140 produced by the scan of the above described stages are almost removed. However, since the reactive force are not entirely removed by the counter force, subtle vibrations (hereinafter referred to as residual vibrations) in the six freedom degree directions (X, Y, Z, X$\Theta$, Y$\Theta$ and Z$\Theta$ directions) remain in the exposure apparatus body 140.

The variation of the exposure apparatus body 140 due to the residual vibrations is respectively detected by the six acceleration sensors 105X1, 105X2, 105Y1, 105Y2, 105Z1 and 105Z2 mounted to the fixed platen 106 of the exposure apparatus body 140. Based on the six acceleration sensors 105X1, 105X2, 105Y1, 105Y2, 105Z1 and 105Z2, the computation circuit 154A of the reference of the center of gravity in the vibration controlling circuit 154 performs a predetermined matrix computation to obtain the vibrations in the six freedom degree directions in the position of the center of gravity of the exposure apparatus body 140, and performs a matrix computation for sharing the vibrations in the six freedom degree directions among the eight actuators, thereby supplying them to the actuators through the actuator controlling circuit 111 as a feedback signal. Therefore, based on the feedback signal these actuators are controlled by the actuator controlling circuit 111 so that the above described residual vibrations are suppressed speedily. In this case, in the second embodiment, since the vibrations in the six freedom degree directions in the position of the center of gravity G of the exposure apparatus body are obtained on the basis of the value of the acceleration sensor and moreover the feedback signals to suppress the vibrations in the six freedom degree directions are applied to the actuators, the residual vibrations are more effectively suppressed, unlike other projection exposure apparatus in which the value of the acceleration sensor is fed back to the actuator disposed in a position facing thereto.

However, in the second embodiment, even before the residual vibrations are completely suppressed, a high precise exposure can be performed. Specifically, there is provided a computation circuit 154B within the vibration controlling circuit which performs a predetermined matrix computation based on the outputs from the six acceleration sensors 105X1, 105X2, 105Y1, 105Y2, 105Z1, and 105Z2 to obtain the vibrations in the two freedom degree directions the X and Y-directions) using the fixed mirror as a reference. Since the vibrations in the X and Y two freedom degree directions at the position of the fixed mirror 144 computed by the computing circuit 154B are fed back to the reticle stage controlling circuit 148, the control for the reticle stage 127 is performed by the reticle stage controlling circuit 148, while considering the vibrations. Therefore, the position where the pattern of the reticle R is transferred never changes in spite the vibrations are in the X and Y-directions.

As described above, according to the projection exposure apparatus 100 of the second embodiment, based on the outputs of the six acceleration sensors 105X, 105X2, 105Y1, 105Y2, 105Z1 and 105Z2, by utilizing the vibrations in the six freedom degree directions at the center of gravity G of the exposure apparatus body computed by in the vibration controlling computing circuit 154 as well as the vibrations in the two freedom degree directions in the fixed mirror 144 for the reticle, the residual vibrations of the exposure apparatus body 140 can be suppressed speedily which could not removed in spite that the counter force was supplied in the feed forward fashion to the actuator. A high precision exposure can be performed even though the residual vibrations are present.

For the second embodiment described above, the description in the case where the six acceleration sensors as a vibration sensor are provided in the exposure apparatus body was made, position sensors (electrostatic capacitance displacement sensor or eddy current displacement sensor) and a speed sensor may be provided as the vibration sensor in stead of them or together with them.

Moreover, for the second embodiment, the description in the case where the vibrations in the six freedom degree directions in the position of the center of gravity G of the exposure apparatus body 140 are obtained was made. The present invention is not limited to this. Based on the outputs from the six acceleration sensors, vibrations in three freedom degree directions or six freedom degree directions in a principal axis of inertia as the center of vibrations may be obtained. Here, the principal axis of inertia is an axis in three directions possessed by the exposure apparatus body, on which the apparatus easily rotates.

Moreover, in the second embodiment, based on the output of the acceleration sensor, the description in the case where the vibrations in the two freedom degree directions in the fixed mirror 144 for the reticle are obtained was made. The present invention is not limited to this. The projection exposure apparatus may be constituted so that vibrations in the two freedom degree directions in the fixed mirror for the wafer are obtained and a feedback signal is supplied to the wafer stage controlling circuit. Alternately, the projection exposure apparatus may be constituted such that vibrations in the two freedom degree directions in both of the fixed mirrors for the reticle and the wafer are obtained and feedback signals are supplied to both stage controlling circuits.

In the second embodiment, the description was made, in the case where the vibrations in the two freedom degree directions in the position of the fixed mirror 144 fixed to the outer periphery of the projection optical system PL are obtained. The place where the third reflection mirror (the fixed mirror) is set is not limited to this. Though the third reflection mirror is set in any place, the effects of the present invention are exhibited, as long as the third mirror is set in a place where the vibrations of the exposure apparatus body have effect on the measurement values.

For the second embodiment, the description was made, in the case where the present invention is applied to the step and scan projection apparatus. The scope of the present invention is not limited to this. The present invention can be applied to an projection apparatus, as long as at least one movement stage is mounted on the exposure apparatus. For example, the present invention can be suitably applied to a step and repeat reduction projection exposure apparatus (so called a stepper).

For the second embodiment, the description was made, in the case where the side surface of the reticle stage is formed is subjected to a mirror polishing treatment, thereby forming the reflection surface. The present invention is not limited to this. It is a matter of course that a movement mirror as the reflection mirror may be provided on the wafer stage and the reticle stage. The exposure apparatus of the second embodiment is the one, which transfers through the projection optical system PL the pattern of the mask R mounted on the stage 127 onto the substrate W mounted on the second stage 120. The exposure apparatus of the present invention comprises stage movement signal output means 142 for outputting a movement signal to at least one of the first and second stages 120 and 127; stage controlling means 148 for controlling said stages based on said movement signal; vibration sensors 105X1, 105X2, 105Y1, 105Y2, 105Z1 and 105Z2 fir detecting the vibrations of the exposure apparatus body 140 on which said first and second stages 120 and 127 are mounted; at least one actuator 4A to 4D, and 32A to 32D provided in said exposure apparatus body 140; drive controlling means 111 for controlling a drive of said actuator so as to control the vibrations of said exposure apparatus body 140; counter force computation means 152 for computing a counter force for a movement of said exposure apparatus 140 to supply it to said drive controlling means 111 in a feed forward fashion; and vibration controlling computation means 154 for computing, based on detection results of said vibration sensors, an actuator drive feedback signal to be supplied to said drive controlling means 111, as well as a stage feedback signal to be supplied to said stage controlling means 148 so as not to change the position on the said substrate W where said pattern is transferred. In the exposure apparatus constructed as above, when a movement signal is outputted from the stage movement signal outputting means to at least one of the first and second stages, the corresponding stage is controlled by the stage controlling means, based on the movement signal. At this time, by the counter force computation means, the instruction value of the counter force for the movement of the exposure apparatus is computed based on the movement signal by the counter force computation means. The instruction value is input to the drive controlling means in the feed forward fashion. For this reason, when the stages are moved based on the control of the stage controlling means, the vibrations produced in the exposure apparatus body are almost suppressed by the counter force generated by the actuator the drive of which is controlled, based on the instruction value of the counter force, by the drive controlling means. The vibrations (residual vibrations) of the exposure apparatus body which are not suppressed to a perfect degree are detected by the vibration sensor. Then, based on the detection result of the vibration sensor, the vibration controlling computation means computes the actuator drive feedback signal to be supplied to the drive controlling means, as well as the stage feedback signal to be supplied to the stage controlling means so as not to change the position of the substrate where the pattern is transferred. Thus, the actuator is driven by the drive controlling means, based on the actuator drive feedback signal. Therefore, the residual vibrations are removed, and, at the same time, the stage is driven, based on the stage feedback signal, by the stage controlling means, so as not to change the position of the substrate where the pattern is transferred.

Moreover, in the second embodiment, since the feedback signals for driving the actuators are supplied thereto based on the detection results of the vibration sensors, the residual vibrations of the exposure apparatus body can be suppressed. Since the stage feedback signal is supplied so as not to change the position of the substrate where the pattern is transferred, even when the residual vibrations that are not suppressed to the perfect degree exist in the exposure apparatus body, the stage moves as if the pattern of the mask were completely at rest on the substrate. Therefore, it is possible to perform a high precision exposure, resulting in an increase in a through put.

In the second embodiment, when there are further provided a first reflection mirror 127a provided on said first stage 127; a second reflection mirror 129a provided on said second stage 120; third reflection mirrors 144 and 146 fixed to fixing portion outside of said stages of said exposure apparatus body 140; and interference meters 130X, 130Y, 131X and 131Y for irradiating a beam of light onto either said first reflection mirror 127a or said second and third reflection mirrors 120a, and 144 and 146 to measure the position of one of said first and second stages 127 and 120, said vibration controlling computation means 154 computes the vibration state of said third reflection mirror positions 144 and 146 in a two dimensional direction on the horizontal plane. This vibration state should be preferably fed back to said stage controlling means 148 so as to control at least one of said first and second stages 127 and 120. If such structure is adopted, the vibration state of the third reflection mirror position in the two dimensional direction on the horizontal plane is computed by the vibration controlling computation means. This vibration state is fed back to at least one of the fist and second stages to control it. Even when errors originating in the vibrations of the position of the third reflection mirror are included in the measurement value of the position of one of the first and second stages, the stage controlling means can perform a precise position control of the stage, in which the errors are canceled based on the feedback signal. Therefore, it is made easy to control the stage so as not to change the position of the substrate where the pattern is transferred.

In the second embodiment, the foregoing vibration controlling computation means 54 is constructed such that the vibration state in freedom degree directions more than two freedom degrees in the center of vibrations of the foregoing exposure apparatus body and this vibration state is fed back to the foregoing drive controlling means 11. With such structure of the vibration controlling computation means 54, the vibration controlling computation means 54 computes, based on the detection result of the vibration sensor, the vibration state in the freedom degree directions more than two freedom degrees in the center of vibrations of the exposure apparatus body and feeds-back this vibration state to the drive control means. Therefore, the actuators are driven based on the feedback signal, whereby the residual vibrations can be suppressed more speedily.

Here, as the center of vibrations, the center of gravity of the exposure apparatus body and the center of principal axis of inertia are mentioned typically.

When the vibration suppressing mechanism, the actuator 132, the acceleration sensor 105, the controlling apparatus 142, the reticle stage controlling circuit 148, the wafer stage controlling circuit 150, the counter force computation circuit 152, the vibration controlling circuit 154, the actuator controlling circuit 111 and the like in the first and second embodiments are built into the apparatus and they are used collectively, faulty exposures due to the vibrations produced in the exposure apparatus body are more suppressed, resulting in more precise projection exposures.

As described above, according to the present invention, there can be provided effects that occurrences of the faulty exposures due to the positional deviation of the mask from the photosensitive substrate originating from the vibrations of the exposure apparatus body can be suppressed.

From the invention thus described, it will be obvious that the invention may be varied in many ways Such variations are not to be regarded as a departure from the spirit and scope of the invention, and all such modifications as would be obvious to one skilled in the art are intended for inclusion within the scope of the following claims.

What is claimed is:

1. An exposure apparatus for projecting an image pattern on a mask onto a photosensitive substrate, said apparatus comprising:
   a body;
   a substrate stage movable with respect to said body and constructed so as to hold the photosensitive substrate thereon;
   a mask stage movable with respect to said body and constructed so as to hold the mask thereon, said mask stage comprising a rough movement stage which scan-moves according to the movement of said substrate stage, and a fine movement stage which moves with respect to said rough movement stage and substantially integrally with said rough movement stage and corrects the relative positional relationship between the mask and the photosensitive substrate;
   a measuring device which respectively measures the positions of said mask stage and said substrate stage;
   a vibration sensor which measures vibrations of at least a portion of the body; and
   a stage controller connected to said measuring device and said vibration sensor and having a speed control loop which causes said fine movement stage and said substrate stage to scan at a predetermined speed on the basis of a measurement value of said measuring device in order to perform a projection of said image pattern for inputting an output of said vibration sensor which measures a vibration caused by said scanning, into said speed control loop.

2. The exposure apparatus according to claim 1, wherein said vibration sensor is an acceleration meter.

3. An exposure apparatus according to claim 1, wherein in said stage controller, a speed command value is inputted in feed-forward fashion to said speed control loop for said speed control.

4. An exposure apparatus according to claim 1, wherein said stage controller has a position control loop for controlling a position of said mask stage, which is different from said speed control loop for controlling speed, and said measurement value of said vibration sensor is introduced into said position control loop.

5. An exposure apparatus according to claim 4, wherein said stage controller is a multi-loop control system having said speed control loop in said position control loop.

6. An exposure apparatus according to claim 1, further comprising:
   at least one actuator located in said body;
   a drive controller connected to said vibration sensor and said actuator, said drive controller controlling driving of said actuator so as to suppress the vibration of said body; and
   a counter-force calculator connected to said drive controller, said counter-force calculator calculating counter-force of said body based on a moving signal for moving at least one of said mask stage and said substrate stage and performing feedforward input to said drive controller.

7. An exposure apparatus according to claim 6, wherein said counter-force calculator calculates a center of gravity of said body and calculates a counter force in response to the calculated center of gravity of said body.

8. An exposure apparatus according to claim 6, wherein said stage controller calculates vibration of a reference position of said measuring device based on the vibration of said body which is measured by said vibration sensor to control said mask stage based on the calculated result.

9. An exposure apparatus which exposes a pattern formed on a mask onto a photosensitive substrate, comprising:
   a body;
   a mask stage movable with respect to said body and having a rough movement stage and a fine movement stage, said mask stage constructed so as to mount the mask thereon;
   a substrate stage movable with respect to said body and constructed so as to mount the photosensitive substrate thereon;
   a measuring device which respectively measures the position of said mask stage and said substrate stage;
   a vibration sensor which measures vibrations of at least a portion of said body other than said mask stage and said substrate stage; and
   a stage control system connected to said measuring device and said vibration sensor to perform synchronizing control of said mask stage and said substrate stage by controlling said fine movement stage, said stage control system being controlled on a feed-forward fashion, and controlling a position and a speed of said fine movement stage on the basis of an output of said vibration sensor which measures a vibration caused by a synchronizing movement of said mask stage and said substrate stage.

10. The exposure apparatus according to claim 9, wherein said mask stage and said substrate stage are relatively scanned by said stage control system at a predetermined speed ratio relative to said projection optical system.

11. The exposure apparatus according to claim 9, wherein a position of said fine movement stage is controlled based on a measurement value inputted from said vibration sensor in a feed-forward fashion as well as a measurement value of said measuring device.

12. The exposure apparatus according to claim 9, wherein said vibration sensor measures vibrations of said projection optical system.

13. An exposure apparatus according to claim 9, wherein said stage control system converts the vibration into speed from a value obtained by integrating said measured vibration.

14. An exposure apparatus according to claim 13, wherein said stage control system obtains a position of said fine movement stage by integrating the difference between speed of said fine movement stage and the value obtained by integrating said measured vibration.

15. An exposure apparatus according to claim 9, wherein in said stage control system, the difference speed of said fine movement stage and speed of said substrate stage is inputted in feedforward fashion to a fine movement stage portion of said stage control system.

16. An exposure apparatus according to claim 9, wherein in said stage control system, a measurement value of said vibration sensor is inputted in feedforward fashion to a position control system of said fine movement stage.

17. An exposure apparatus according to claim 9, wherein said vibration sensor comprises an acceleration sensor.

18. An exposure apparatus according to claim 9, further comprising:

at least one actuator located in said body;
a drive controller connected to said vibration sensor and said actuator, said drive controller controlling driving of said actuator so as to suppress the vibration of said body; and
a counter-force calculator connected to said drive controller, said counter-force calculator calculating counter-force of said body based on a moving signal for moving at least one of said mask stage and said substrate stage and performing feed-forward input to said drive controller.

19. An exposure apparatus according to claim 18, wherein said counter-force calculator calculates a center of gravity of said body and calculates a counter force in response to the calculated center of gravity of said body.

20. A projection exposure apparatus which transfers a pattern of a mask held on a first stage onto a substrate held on a second stage through a projection optical system, comprising:
   a stage movement signal outputting device to output a movement signal to at least one of said first and second stages;
   a vibration sensor to detect vibrations of at least a portion of an exposure apparatus body, on which said first and second stages are mounted;
   a stage control circuit to control said first and second stages based on said movement signal and to input a signal of said vibration sensor indicative of vibrations of said exposure apparatus which is caused by the movement of said first and second stages, to control said first and second stages;
   at least one actuator provided in said exposure apparatus body;
   a drive control circuit to control a drive of said actuator so as to suppress the vibrations of said exposure apparatus body;
   a counter force computing circuit to compute a counter force against variations of said exposure apparatus body to input the counter force to said control circuit in a feed-forward fashion, based on said movement signal;
   a vibration controller which computes an actuator drive feedback signal to be supplied to said drive control circuit and a stage feedback signal to be supplied to said stage control circuit based on a detection result of said vibration sensor;
   a first reflection mirror provided on said first stage;
   a second reflection mirror provided on said second stage;
   a third reflection mirror fixed to a fixing portion outside said stage of said exposure apparatus body; and
   an interference meter for irradiating light onto either said first reflection mirror or said second reflection mirror and onto said third reflection mirror and measuring a position of either said first stage or said second stage;
   wherein said vibration control computing circuit computes a vibration state in a two dimensional on a horizontal plane of said third reflection mirror position, and feed-backs the vibration state to said stage control circuit so as to control at least one of said first and second stages.

21. The exposure apparatus according to claim 20, wherein said vibration control computing circuit computes an oscillation state in a direction of degree of freedom of three numbers or more in a center of vibrations of said exposure apparatus body, and feed-backs this vibration state to said drive control circuit.

22. A method for making an exposure apparatus, said method comprising the steps of:
providing a body;
providing a mask stage movable with respect to said body, said mask stage having a rough movement stage and a fine movement stage, and adapted to mount the mask;
providing a substrate stage movable in synchronous with said mask stage and adapted to mount the photosensitive substrate;
providing a measuring device to measure the position of either the mask mounted on said mask stage or the photosensitive substrate mounted on said substrate stage;
providing a vibration sensor to measure vibration of the body;
providing a position controller connected to said measuring device and said vibration sensor, to control the position of either the mask mounted on said mask stage or the photosensitive substrate mounted on said substrate and having a speed loop for controlling a speed of said mask stage to input an output of said vibration sensor into said speed control loop to control the speed of said mask stage;
providing an actuator to support said body and to correct the change in an orientation of said body and the vibration of said body; and
providing an actuator controller connected to said vibration sensor and said position controller to control said actuator so as to correct the change in orientations of said body which is caused by the movements of said mask stage and said substrate stage and vibrations detected by said vibration sensor.

23. An exposure method for exposing a pattern formed on a mask held with a mask stage onto a photosensitive substrate held with a substrate stage, said method comprising the steps of:
measuring a position of either said mask or said photosensitive substrate and outputting a measuring value regarding said position;
measuring vibration of a body mounting said mask stage thereon and outputting value regarding said vibration;
inputting the value of said vibration into speed control systems of said mask stage to perform speed control of said mask stage;
inputting the value of said vibration into a vibration control system which controls a deviation of said body; and
controlling a speed of said mask stage having a rough movement stage and a fine movement stage, by fine moving said fine movement stage in synchronization with the movement of said substrate stage, based on the value of said vibration.

24. An exposure method according claim 23, further comprising step of:
scanning said mask stage or said substrate stage at a predetermined ratio relative to a projection optical system which exposes said pattern onto said photosensitive substate.

25. An exposure apparatus for projecting an image pattern on a mask onto a photosensitive substrate, said apparatus comprising:
a body;
a substrate stage constructed to hold the photosensitive substrate thereon;
a mask stage movable with respect to said body and constructed to hold the mask thereon, said mask stage comprising a rough movement stage which scan-moves according to the movement of said substrate stage, and a fine movement stage which moves with respect to said rough movement stage and substantially integrally with said rough movement stage and corrects the relative positional relationship between the mask and the photosensitive substrate;
a measuring device which respectively measures the positions of said mask stage and said substrate stage;
a vibration sensor which measures vibrations of at least a portion of the body; and
a stage controller connected to said measuring device and said vibration sensor and having speed control loop which causes said fine movement stage and said substrate stage to scan at a predetermined speed on the basis of a measurement value of said measuring device in order to perform a projection of said image pattern for inputting an output of said vibration sensor which measures a vibration caused by said scanning, into said speed control loop.

26. The exposure apparatus according to claim 25, wherein said substrate stage is movable with respect to said body.

27. The exposure apparatus according to claim 25, wherein in said stage controller, a speed command value is inputted in feed-forward fashion to said speed control loop for speed control.

28. An exposure apparatus which exposes a pattern formed on a mask onto a photosensitive substrate, comprising:
a body;
a mask stage movable with respect to said body and having a rough movement stage and a fine movement stage and constructed to mount the mask thereon;
a substrate stage constructed to hold the photosensitive substrate thereon;
a measuring device which respectively measures the position of said mask stage and said substrate stage;
a vibration sensor which measures vibration of at least a portion of said body other than said mask and said substrate stage; and
a stage control system connected to said measuring device and said vibration sensor to perform synchronizing control of said mask stage and said substrate stage by controlling said fine movement stage, said stage control system being controlled on a feed-forward fashion, and controlling a portion and a speed of said fine movement stage on the basis of an output of said sensor which measures a vibration caused by a synchronizing movement of said mask stage and said substrate stage.

29. The exposure apparatus according to claim 28, wherein said substrate stage is movable with respect to said body.

30. The exposure apparatus according to claim 28, wherein a position of said fine movement stage is controlled based on a measurement value inputted from said vibration sensor in a feed-forward fashion as well as a measurement value of said measuring device.

* * * * *